(12) United States Patent
Garcia

(10) Patent No.: US 11,368,139 B2
(45) Date of Patent: *Jun. 21, 2022

(54) SMALL TRANSVERSELY-EXCITED FILM BULK ACOUSTIC RESONATORS WITH ENHANCED Q-FACTOR

(71) Applicant: Resonant Inc., Austin, TX (US)

(72) Inventor: Bryant Garcia, Belmont, CA (US)

(73) Assignee: Resonant Inc., Austin, TX (US)

( * ) Notice: Subject to any disclaimer, the term of this patent is extended or adjusted under 35 U.S.C. 154(b) by 2 days.

This patent is subject to a terminal disclaimer.

(21) Appl. No.: 17/460,166

(22) Filed: Aug. 28, 2021

(65) Prior Publication Data

US 2021/0391846 A1  Dec. 16, 2021

Related U.S. Application Data

(63) Continuation of application No. 17/229,767, filed on Apr. 13, 2021.

(Continued)

(51) Int. Cl.
*H03H 9/205* (2006.01)
*H03H 9/02* (2006.01)
*H03H 9/56* (2006.01)

(52) U.S. Cl.
CPC .......... *H03H 9/205* (2013.01); *H03H 9/0211* (2013.01); *H03H 9/02015* (2013.01); *H03H 9/02228* (2013.01); *H03H 9/568* (2013.01)

(58) Field of Classification Search
CPC ............. H03H 9/02015; H03H 9/0211; H03H 9/02228; H03H 9/205; H03H 9/568;

(Continued)

(56) References Cited

U.S. PATENT DOCUMENTS 5,204,575 A * 4/1993 Kanda ................ H03H 9/02818
                                              310/313 B
5,446,330 A   8/1995 Eda et al.

(Continued)

FOREIGN PATENT DOCUMENTS

WO  2016017104  2/2016
WO  2018003273  1/2018

OTHER PUBLICATIONS

Buchanan "Ceramic Materials for Electronics" 3rd Edition, first published in 2004 by Marcel Dekker, Inc. pp. 496 (Year 2004).

(Continued)

*Primary Examiner* — Samuel S Outten
(74) *Attorney, Agent, or Firm* — SoCal IP Law Group LLP; Angelo Gaz

(57) ABSTRACT

An acoustic resonator device includes a conductor pattern formed on a surface of a piezoelectric plate. The conductor pattern includes a first busbar, a second busbar, and n interleaved parallel fingers of an interdigital transducer (IDT), where n is a positive integer. The fingers extend alternately from the first and second busbars. A first finger and an n'th finger are at opposing ends of the IDT. The conductor pattern also includes a first reflector element proximate and parallel to the first finger and a second reflector element proximate and parallel to the n'th finger. A center-to-center distance pr between the first reflector element and the first finger and between the second reflector element and the n'th finger is greater than or equal to 1.2 times a pitch p of the IDT and less than or equal to 1.5 times the pitch p.

17 Claims, 13 Drawing Sheets

Related U.S. Application Data

(60) Provisional application No. 63/012,849, filed on Apr. 20, 2020, provisional application No. 63/066,520, filed on Aug. 17, 2020, provisional application No. 63/074,991, filed on Sep. 4, 2020.

(58) Field of Classification Search
CPC ........... H03H 9/02685; H03H 9/02803; H03H 9/02866; H03H 9/0504; H03H 9/173; H03H 9/174
USPC ...................................... 333/195; 310/313 D
See application file for complete search history.

(56) References Cited

U.S. PATENT DOCUMENTS

| | | | |
|---|---|---|---|
| 5,552,655 A | 9/1996 | Stokes et al. | |
| 5,631,515 A * | 5/1997 | Mineyoshi | H03H 9/02866 310/313 B |
| 5,726,610 A | 3/1998 | Allen et al. | |
| 5,729,186 A * | 3/1998 | Seki | H03H 9/6483 310/313 A |
| 5,853,601 A | 12/1998 | Krishaswamy | |
| 6,172,582 B1 * | 1/2001 | Hickernell | H03H 9/25 310/313 D |
| 6,271,617 B1 * | 8/2001 | Yoneda | H03H 9/6483 310/313 D |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,570,470 B2 * | 5/2003 | Maehara | H03H 9/6483 310/313 B |
| 6,707,229 B1 | 3/2004 | Martin | |
| 6,710,514 B2 | 3/2004 | Ikada et al. | |
| 6,833,774 B2 * | 12/2004 | Abbott | H03H 9/6483 310/313 A |
| 7,009,468 B2 * | 3/2006 | Kadota | H03H 9/02551 310/313 B |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka et al. | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,148,121 B2 * | 9/2015 | Inoue | H03H 9/14538 |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,812,048 B2 * | 10/2020 | Nosaka | H03H 9/6403 |
| 10,819,309 B1 | 10/2020 | Turner et al. | |
| 10,826,462 B2 | 11/2020 | Plesski et al. | |
| 10,868,510 B2 | 12/2020 | Yantchev et al. | |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 2002/0079986 A1 | 6/2002 | Ruby et al. | |
| 2002/0158714 A1 | 10/2002 | Kaitila et al. | |
| 2002/0189062 A1 | 12/2002 | Lin et al. | |
| 2003/0042998 A1 * | 3/2003 | Edmonson | H03H 9/25 333/195 |
| 2003/0080831 A1 | 5/2003 | Naumenko et al. | |
| 2003/0199105 A1 | 10/2003 | Kub et al. | |
| 2004/0100164 A1 | 5/2004 | Murata | |
| 2004/0261250 A1 | 12/2004 | Kadota et al. | |
| 2005/0077982 A1 * | 4/2005 | Funasaka | H03H 9/02574 333/195 |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0152107 A1 * | 7/2006 | Tanaka | H03H 9/02551 310/313 R |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0246559 A1 | 10/2008 | Ayazi | |
| 2010/0064492 A1 | 3/2010 | Tanaka | |
| 2010/0123367 A1 | 5/2010 | Tai et al. | |
| 2011/0018389 A1 | 1/2011 | Fukano et al. | |
| 2011/0018654 A1 | 1/2011 | Bradley et al. | |
| 2011/0109196 A1 | 5/2011 | Goto et al. | |
| 2011/0278993 A1 | 11/2011 | Iwamoto | |
| 2012/0073390 A1 * | 3/2012 | Zaghloul | G01N 29/022 73/865 |
| 2012/0286900 A1 | 11/2012 | Kadota et al. | |
| 2013/0127554 A1 * | 5/2013 | Yamanaka | H03H 9/643 331/155 |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0042417 A1 | 2/2015 | Onodera et al. | |
| 2015/0165479 A1 | 6/2015 | Lasiter et al. | |
| 2015/0319537 A1 | 11/2015 | Perois et al. | |
| 2015/0333730 A1 | 11/2015 | Meltaus et al. | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179225 A1 | 6/2017 | Kishimoto | |
| 2017/0179928 A1 | 6/2017 | Raihn et al. | |
| 2017/0214381 A1 | 7/2017 | Bhattacharjee | |
| 2017/0214387 A1 | 7/2017 | Burak et al. | |
| 2017/0222617 A1 | 8/2017 | Mizoguchi | |
| 2017/0222622 A1 | 8/2017 | Solal et al. | |

(56) References Cited

U.S. PATENT DOCUMENTS

| | | |
|---|---|---|
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0379351 A1* | 12/2019 | Miyamoto .............. H03H 9/547 |
| 2019/0386636 A1 | 12/2019 | Plesski et al. |
| 2020/0007110 A1* | 1/2020 | Konaka .............. H03H 9/02637 |
| 2020/0021272 A1* | 1/2020 | Segovia Fernandez .................... H03B 5/364 |
| 2020/0036357 A1 | 1/2020 | Mimura |
| 2020/0235719 A1 | 7/2020 | Yantchev et al. |
| 2020/0350891 A1 | 11/2020 | Turner |
| 2021/0013859 A1 | 1/2021 | Turner et al. |
| 2021/0328574 A1* | 10/2021 | Garcia ................... H03H 9/568 |

OTHER PUBLICATIONS

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.

Zou, Jie "High-Performance Aluminum Nitride Lamb Wave Resonators for RF Front-End Technology" University of California, Berkeley, Summer 2015, pp. 63 (Year 2015) 00 Jan. 2015.

Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Material Properties of Tibtech Innovations, © 2018 Tibtech Innovations (Year 2018). 2018.

USPTO/ISA, International Search Report and Written Opinion for PCT Application No. PCT/US2020/45654 dated Oct. 29, 2020.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

USPTO/ISA, International Search Report and Written Opinion for PCT Application No. PCT/US2021/024824 dated Jul. 27, 2021, 9 total pages.

* cited by examiner

SMALL TRANSVERSELY-EXCITED FILM BULK ACOUSTIC RESONATORS WITH ENHANCED Q-FACTOR

RELATED APPLICATION INFORMATION

This patent is a continuation of application Ser. No. 17/229,767, filed Apr. 13, 2021, entitled SMALL TRANSVERSELY-EXCITED FILM BULK ACOUSTIC RESONATORS WITH ENHANCED Q-FACTOR, which claims priority to the following provisional patent applications: application No. 63/012,849, filed Apr. 20, 2020, entitled SMALL HIGH Q XBAR RESONATORS; application No. 63/066,520, filed Aug. 17, 2020, entitled SMALL REFLECTORS TO IMPROVE XBAR LOSS; and application No. 63/074,991, filed Sep. 4, 2020, entitled SMALL REFLECTORS TO IMPROVE PERFORMANCE OF TRANSVERSELY-EXCITED FILM BULK ACOUSTIC RESONATORS AT A SPECIFIED FREQUENCY. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
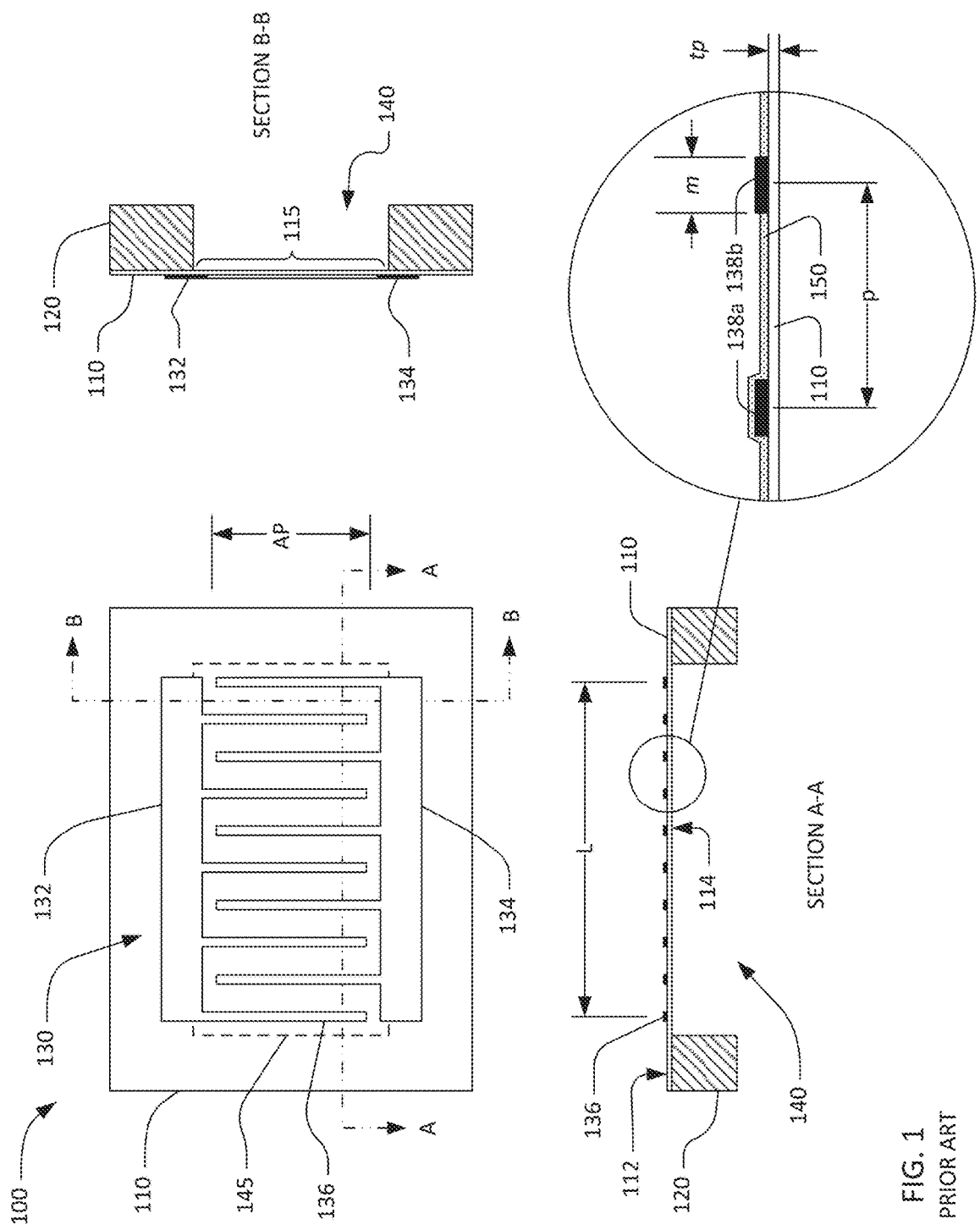
FIG. 1 includes a schematic plan view, two schematic cross-sectional views, and a detail view of a transversely-excited film bulk acoustic resonator (XBAR).

FIG. 1 shows a simplified schematic top view and orthogonal cross-sectional views of an XBAR 100. XBAR resonators such as the resonator 100 may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Referring now to the detailed schematic cross-sectional view, a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide, alumina, or silicon nitride. A thickness of the front side dielectric layer 150 is typically less than about one-third of the thickness tp of the piezoelectric plate 110. The front-side dielectric layer 150 may be formed of multiple layers of two or more materials. In some applications, a back-side dielectric layer (not shown) may be formed on the back side of the piezoelectric plate 110.

The IDT fingers 138a, 138b may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT may be 2 to 20 times the width m of the fingers. The pitch p is typically 3.3 to 5 times the width m of the fingers. In addition, the pitch p of the IDT may be 2 to 20 times the thickness of the piezoelectric plate 210. The pitch p of the IDT is typically 5 to 12.5 times the thickness of the piezoelectric plate 210. The width m of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness of the IDT fingers may be from 100 nm to about equal to the width m. The thickness of the busbars (132, 134) of the IDT may be the same as, or greater than, the thickness tm of the IDT fingers.

Figure 2:
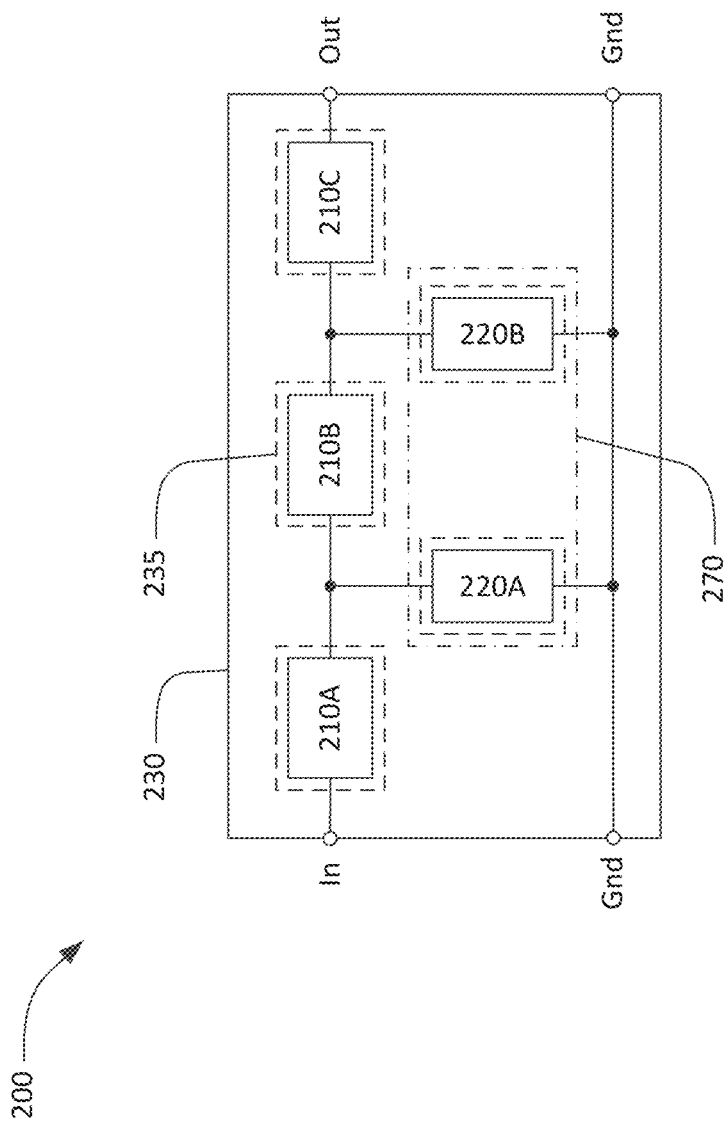
FIG. 2 is a schematic block diagram of a band-pass filter using acoustic resonators.

FIG. 2 is a schematic circuit diagram and layout for a high frequency band-pass filter 200 using XBARs. The filter 200 has a conventional ladder filter architecture including three series resonators 210A, 210B, 210C and two shunt resonators 220A, 220B. The three series resonators 210A, 210B, and 210C are connected in series between a first port and a second port (hence the term "series resonator"). In FIG. 2, the first and second ports are labeled "In" and "Out", respectively. However, the filter 200 is bidirectional and either port may serve as the input or output of the filter. The two shunt resonators 220A, 220B are connected from nodes between the series resonators to ground. A filter may contain additional reactive components, such as capacitors and/or inductors, not shown in FIG. 2. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 200, the three series resonators 210A, B, C and the two shunt resonators 220A, B of the filter 200 are formed on a single plate 230 of piezoelectric material bonded to a silicon substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 2, the cavities are illustrated schematically as the dashed rectangles (such as the rectangle 235). In this example, each IDT is disposed over a respective cavity. In other filters, the IDTs of two or more resonators may be disposed over a single cavity.

Each of the resonators 210A, 210B, 210C, 220A, 220B in the filter 200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband. In some filters, a front-side dielectric layer (also called a "frequency setting layer"), represented by the dot-dash rectangle 270, may be formed on the shunt resonators to set the resonance frequencies of the shunt resonators lower relative to the resonance frequencies of the series resonators.

The Q-factor of an acoustic resonator is commonly defined as the peak energy stored during a cycle of the applied RF signal divided by the total energy dissipated or lost during the cycle. The Q-factor of an XBAR is a complex function of numerous parameters including the length, or number of fingers, in the IDT of the XBAR.

Possible loss mechanisms in an acoustic resonator include resistive losses in the IDT and other conductors; viscous or acoustic losses in the piezoelectric plate, IDT fingers, and other materials; and leakage of acoustic energy out of the resonator structure. The peak energy stored in a resonator is proportional the capacitance of the resonator. In an XBAR resonator, the capacitance is proportional to the number of IDT fingers. Resistive losses and viscous losses are also proportional to the number of IDT fingers. Acoustic energy that leaks from the resonator in the transverse direction (i.e. the direction parallel to the IDT fingers) is proportional to the length of the resonator and thus also proportional to the number of IDT fingers. In contrast, energy lost from the ends of the IDT in the longitudinal direction (i.e. the direction normal to the IDT fingers) is roughly constant, independent of the number of IDT fingers. As the number of IDT fingers and the peak energy stored in an XBAR is reduced, the acoustic energy lost in the longitudinal direction becomes an ever-increasing fraction of the peak energy stored.

Figure 3:
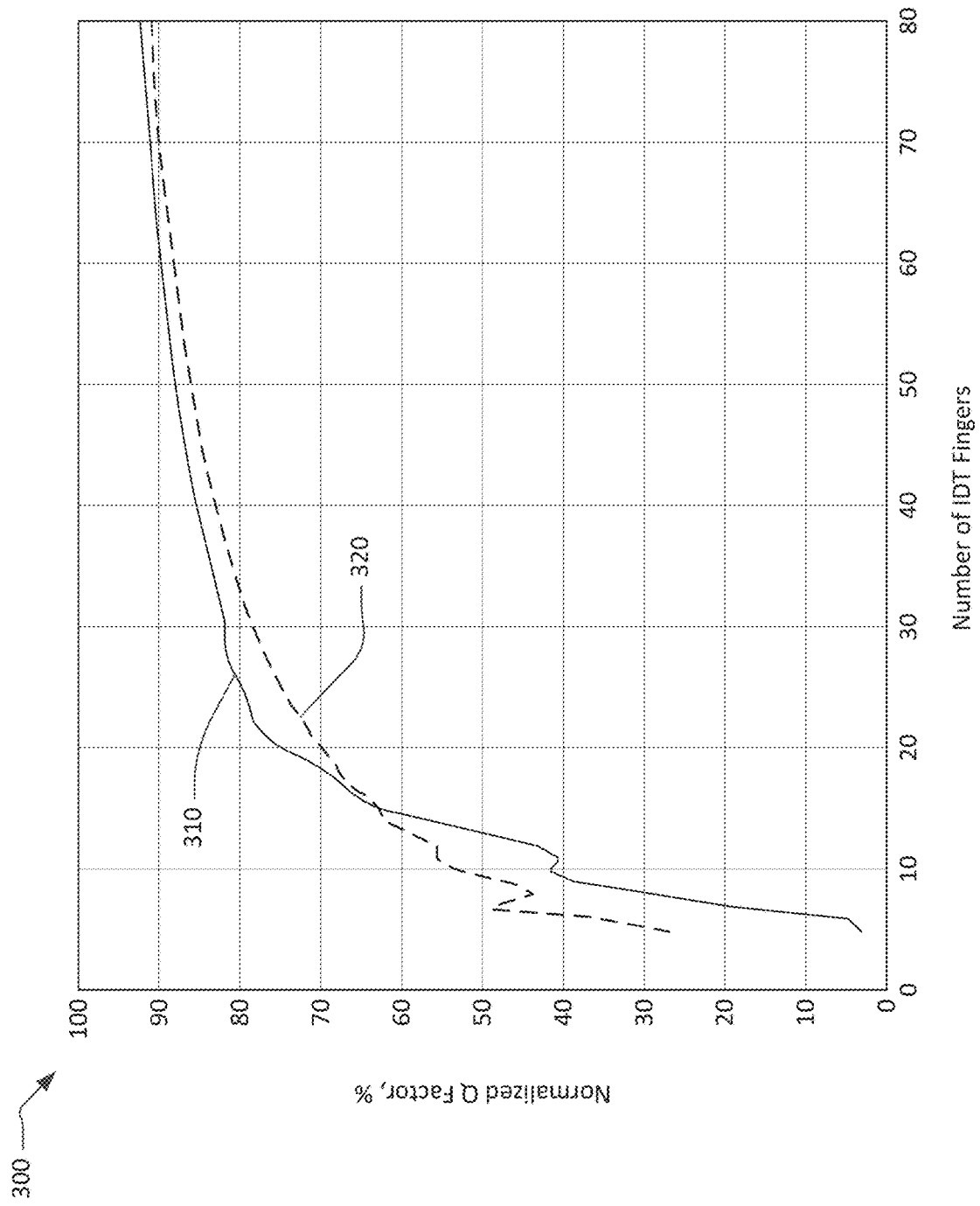
FIG. 3 is a graph of relationships between the Q-factor of an XBAR and the number of fingers in the interdigital transducer (IDT) of the XBAR.

FIG. 3 is a graph of the normalized Q factor of a representative XBAR as a function of the number of fingers in the IDT of the XBAR. The "normalized Q-factor" is the Q-factor of the XBAR with a finite number of IDT fingers divided by the Q-factor of a hypothetical XBAR with the same structure and an infinite number of IDT fingers. In FIG. 3, normalized Q-factor is quantified as a percentage of the Q-factor of the XBAR with an infinite number of IDT fingers. Specifically, the solid curve 310 is a plot of the normalized Q-factor at the resonance frequency and the dashed curve 320 is a plot of the normalized Q-factor at the anti-resonance frequency. The data in FIG. 3 is derived from simulations using a finite element method.

FIG. 3 shows that the normalized Q-factor of an XBAR with a finite number of IDT fingers is less than 100%, which is to say the Q-factor of an XBAR with a finite number of IDT fingers is less than the Q-factor of a similar XBAR with an infinite number of IDT fingers. Although not shown in FIG. 3, the normalized Q-factor of an XBAR may asymptotically approach 100% for a very large number of IDT fingers. As anticipated, the normalized Q-factor depends on the number of IDT fingers. In particular, the normalized Q-factor decreases precipitously for XBARs with less than about 20 IDT fingers due to the increasing significance of acoustic energy lost in the longitudinal direction.

Figure 4:
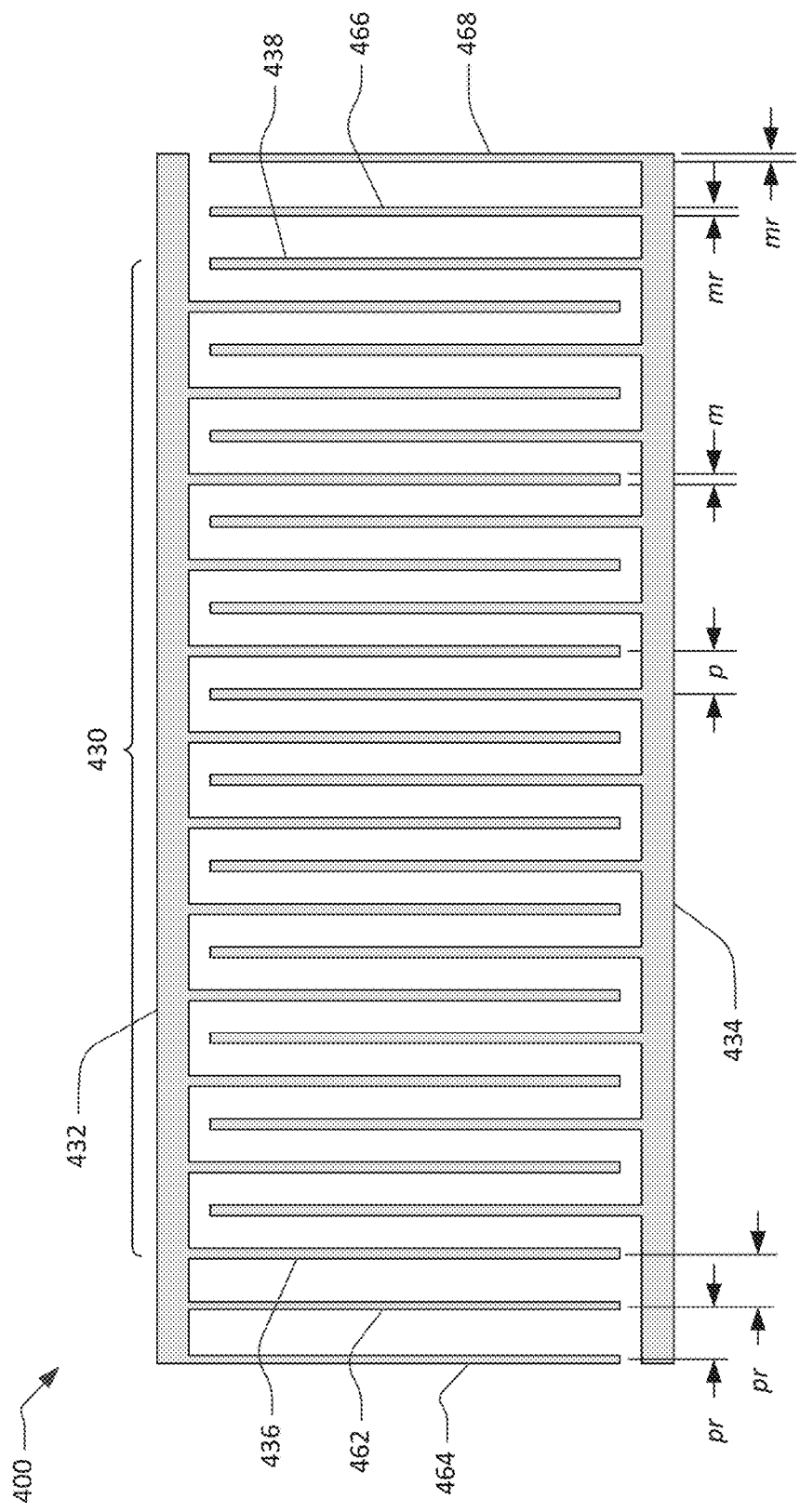
FIG. 4 is a schematic plan view of an IDT with reflector elements.

FIG. 4 is a plan view of an exemplary conductor pattern 400 that reduces the acoustic energy leakage in the longitudinal direction at the ends of an XBAR. The conductor pattern 400 includes an IDT 430 and four reflector elements 462, 464, 466, 468. The IDT 430 includes a first busbar 432, a second busbar 434, and a plurality of n interleaved IDT fingers extending alternately from the first and second busbars. In this example, n, the number of IDT fingers, is equal to 24. In other XBARs, n may be in a range from 20 to 100 or more IDT fingers. IDT finger 436 is the $1^{st}$ finger and IDT finger 438 is the n'th finger. Numbering the IDT fingers from left to right (as shown in FIG. 4) is arbitrary and the designations of the $1^{st}$ and n'th fingers could be reversed.

As shown in FIG. 4, the odd numbered IDT fingers extend from the first busbar 432 and the even numbered IDT fingers extend from the second busbar 434. The IDT 430 has an even number of IDT fingers such that the $1^{st}$ and n'th IDT fingers 436, 438 extend from different busbars. In some cases, an IDT may have an odd number of IDT fingers such that the $1^{st}$ and n'th IDT fingers and all of the reflector elements extend from the same busbar.

A total of four reflector elements are provided outside of periphery of the IDT 430. A first reflector element 462 is proximate and parallel to 1st IDT finger 436 at the left end of the IDT 430. A second reflector element 466 is proximate and parallel to n'th IDT finger 438 at the right end of the IDT 430. An optional third reflector element 464 is parallel to the first reflector element 462. An optional fourth reflector element 468 is parallel to the second reflector element 466.

First and third reflector elements 462, 464 extend from the first busbar 432 and thus are at the same electrical potential as the 1st IDT finger 436. Similarly, second and fourth reflector elements 466 and 468 extend from the second busbar 430 and thus are at the same electrical potential as the n'th IDT finger 438.

The reflector elements 462, 464, 466, 468 are configured to confine acoustic energy to the area of the IDT 430 and thus reduce acoustic energy losses in the longitudinal direction. To this end, the pitch pr between adjacent reflector elements and between reflector elements 462 and 466 and the adjacent first and n'th IDT fingers, respectively, is typically greater than the pitch p of the IDT fingers. The width or mark mr of the reflector elements 462, 464, 466, 468 is not necessarily equal to the mark m of the IDT fingers. As will be described subsequently, the mark mr of the reflector elements may be selected to optimize Q-factor at a specific frequency or range of frequencies.

Figure 5:
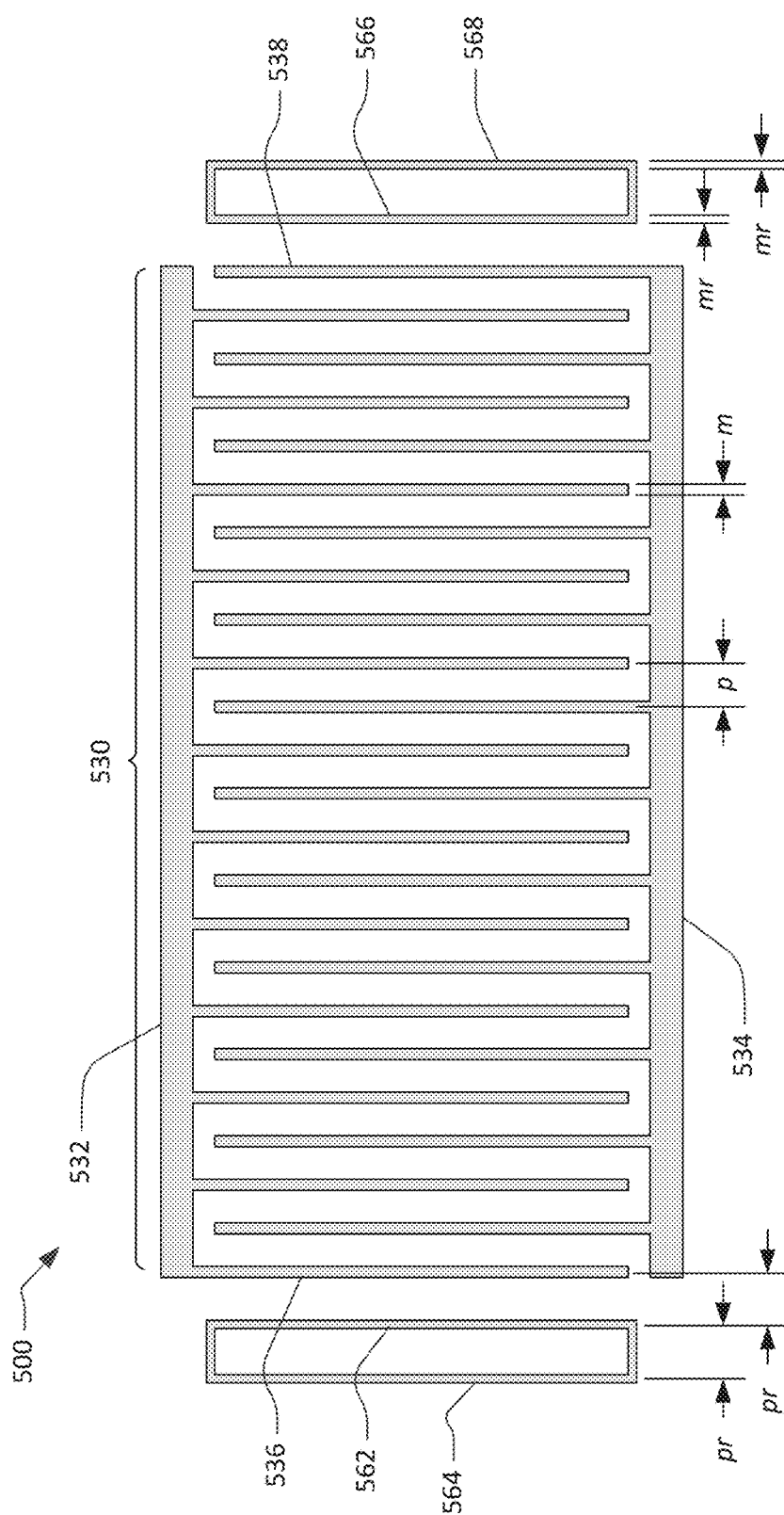
FIG. 5 is a schematic plan view of another IDT with reflector elements.

FIG. 5 is a plan view of another conductor pattern 500 that reduces the acoustic energy leakage in the longitudinal direction at the ends of an XBAR. The conductor pattern 500 includes an IDT 530 and four reflector elements 562, 564, 566, 568. The IDT 530 includes a first busbar 532, a second busbar 534, and a plurality of interleaved IDT fingers extending alternately from the first and second busbars as previously described. IDT fingers 536 and 538 are the $1^{st}$ and n'th IDT fingers at the left and right (as shown in FIG. 5) ends of the IDT 530.

A total of four reflector elements are provided outside of periphery of the IDT 530. First and third reflector elements 562 and 564 are proximate and parallel to $1^{st}$ IDT finger 536 at the left end of the IDT 530. First and third reflector elements 562, 564 are connected to each other but are not connected to either busbar 532, 534. First and third reflector elements 562, 564 are capacitively coupled to 1st IDT finger 536 and thus are at substantially the same electrical potential as the 1st IDT finger 536. The reflector elements are considered to be at substantially the same potential if, when an RF signal is applied between the busbars 532, 534, the potential between the reflector elements and the $1^{st}$ IDT finger is small compared to the potential between adjacent IDT fingers.

Similarly, second and fourth reflector elements 566 and 568 are proximate and parallel to n'th IDT finger 538 at the right end of the IDT 530. Second and fourth reflector elements 566, 568 are connected to each other and not connected to either busbar 532, 534. Second and fourth reflector elements 566, 568 are capacitively coupled to the n'th IDT finger 538 and thus are at nearly the same electrical potential as the n'th IDT finger 538.

The reflector elements 562, 564, 566, 568 are configured to confine acoustic energy to the area of the IDT 530 and thus reduce acoustic energy lost in the longitudinal direction. To this end, the pitch pr between adjacent reflector elements and between reflector elements 562 and 566 and the adjacent terminal IDT fingers is typically greater than the pitch p of the IDT fingers. The width or mark mr of the reflector elements 562, 564, 566, 568 is not necessarily equal to the mark m of the IDT fingers. The mark mr of the reflector elements may be selected to optimize Q-factor for a particular frequency of range of frequencies.

Figure 6:
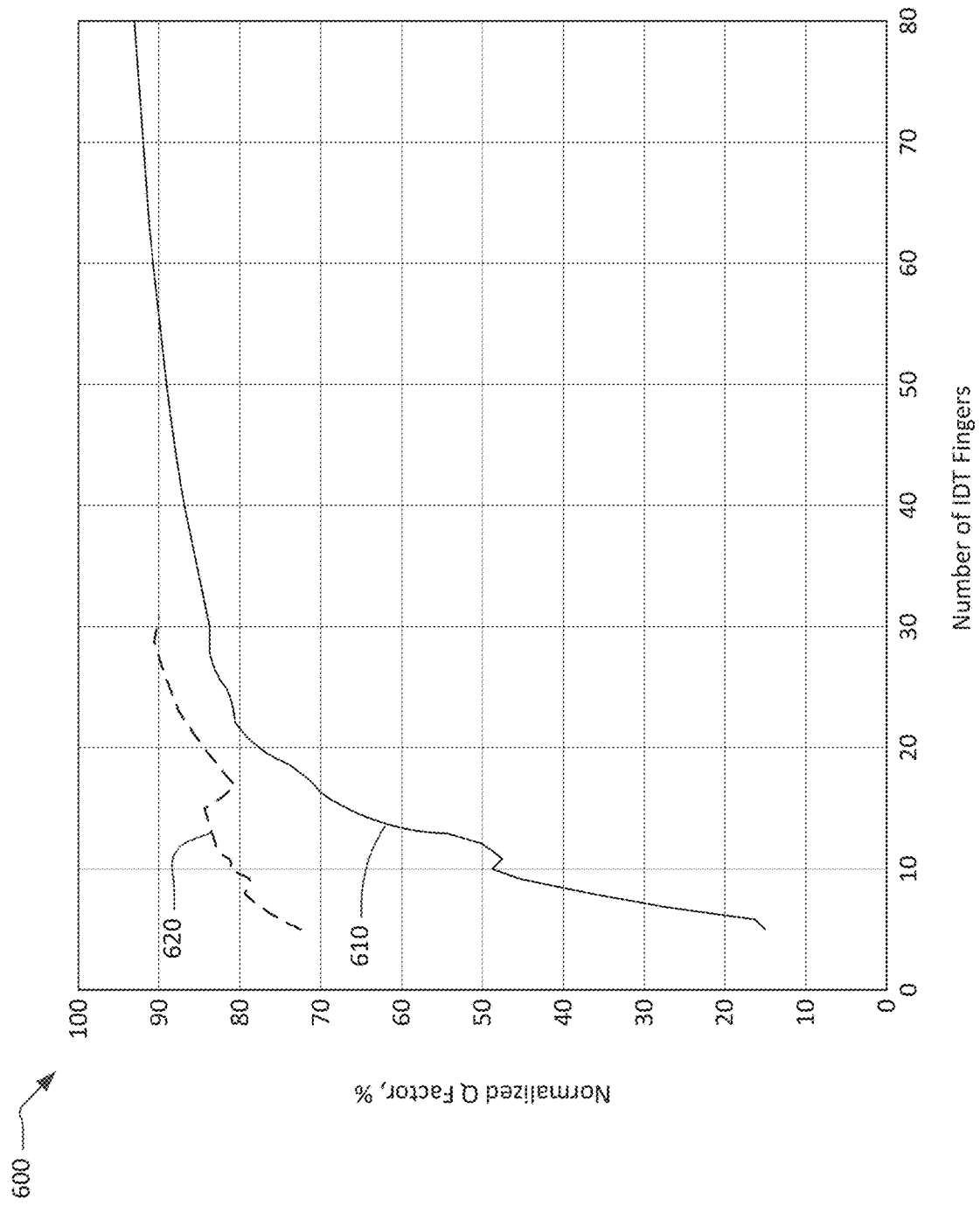
FIG. 6 is a graph comparing the normalized Q-factor of an XBAR with and without reflector elements at the resonance frequency.

FIG. 6 is a graph of the normalized Q-factor as a function of number of IDT fingers for another XBAR with and without reflector elements similar to the reflector elements shown in FIG. 4. Specifically, the solid curve 610 is a plot of the normalized Q-factor of an XBAR without reflector elements at its resonance frequency. The dashed curve 620 is a plot of the normalized Q-factor at the resonance frequency for a similar XBAR with two reflector elements at each side of the IDT. In both cases, the piezoelectric plate is lithium niobate 400 nm thick, the IDT fingers are aluminum 500 nm thick, IDT pitch p=4 microns, and IDT finger mark m=1 micron. For the XBAR with reflector elements, pr=4.2 microns and mr=0.735 microns. With reflector elements, an XBAR with as few as 10 fingers can have a normalized Q-factor up to 80%.

Figure 7:
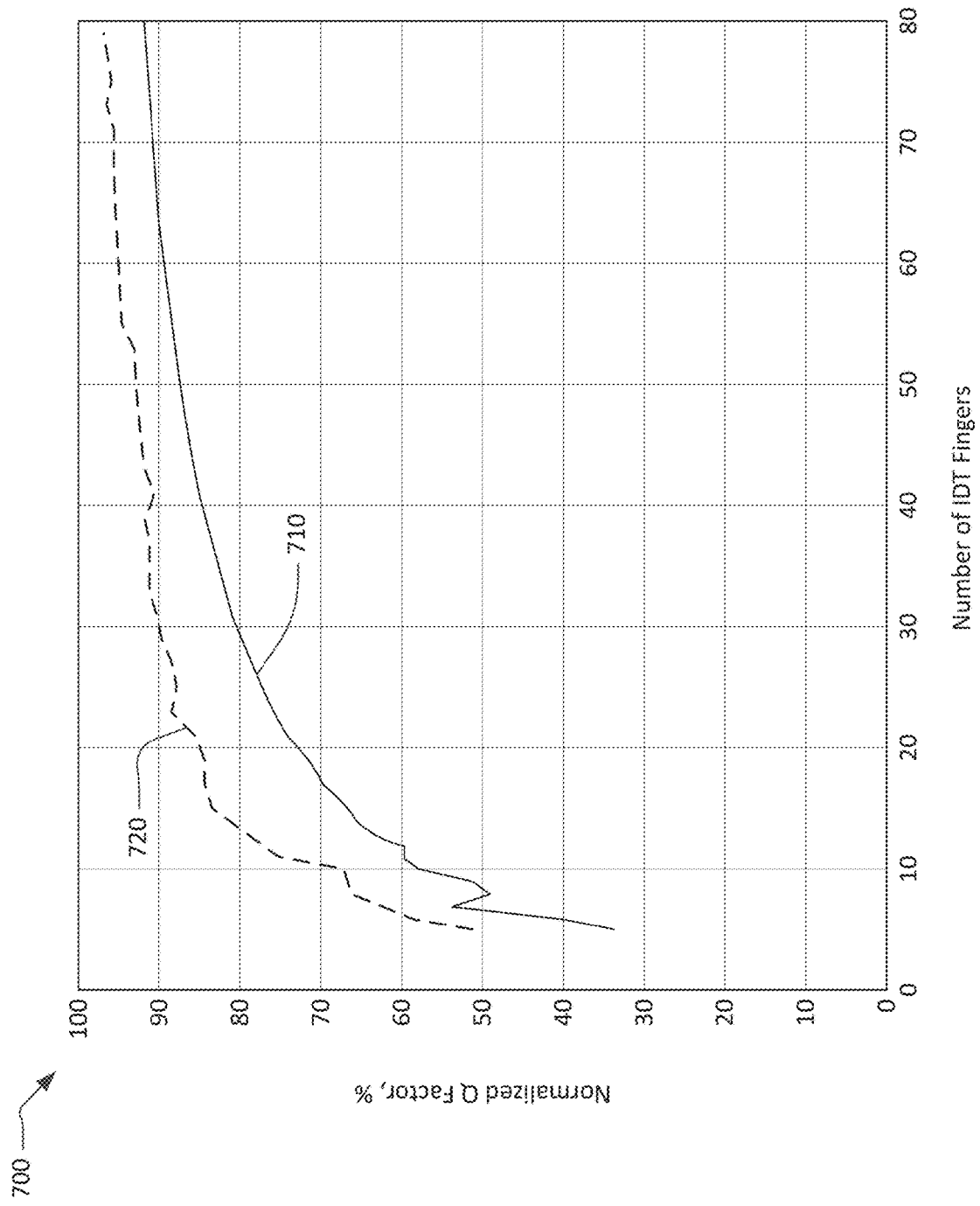
FIG. 7 is a graph comparing the normalized Q-factor of an XBAR with and without reflector elements at the anti-resonance frequency.

FIG. 7 is a graph of the normalized Q-factor as a function of number of IDT fingers for another XBAR with and without reflector elements similar to the reflector elements shown in FIG. 4. Specifically, the solid curve 710 is a plot of the normalized Q-factor of an XBAR without reflector elements at its anti-resonance frequency. The dashed curve 720 is a plot of the normalized Q-factor at the anti-resonance frequency for a similar XBAR with two reflector elements at each side of the IDT. In both cases, the piezoelectric plate is lithium niobate 400 nm thick, the IDT fingers are aluminum 500 nm thick, IDT pitch p=4 microns, and IDT finger mark m=1 micron. For the XBAR with reflector elements, pr=8 microns and mr=0.80 microns. With reflector elements, an XBAR with as few as 14 fingers can have a normalized Q-factor up to 80%.

Figure 8:
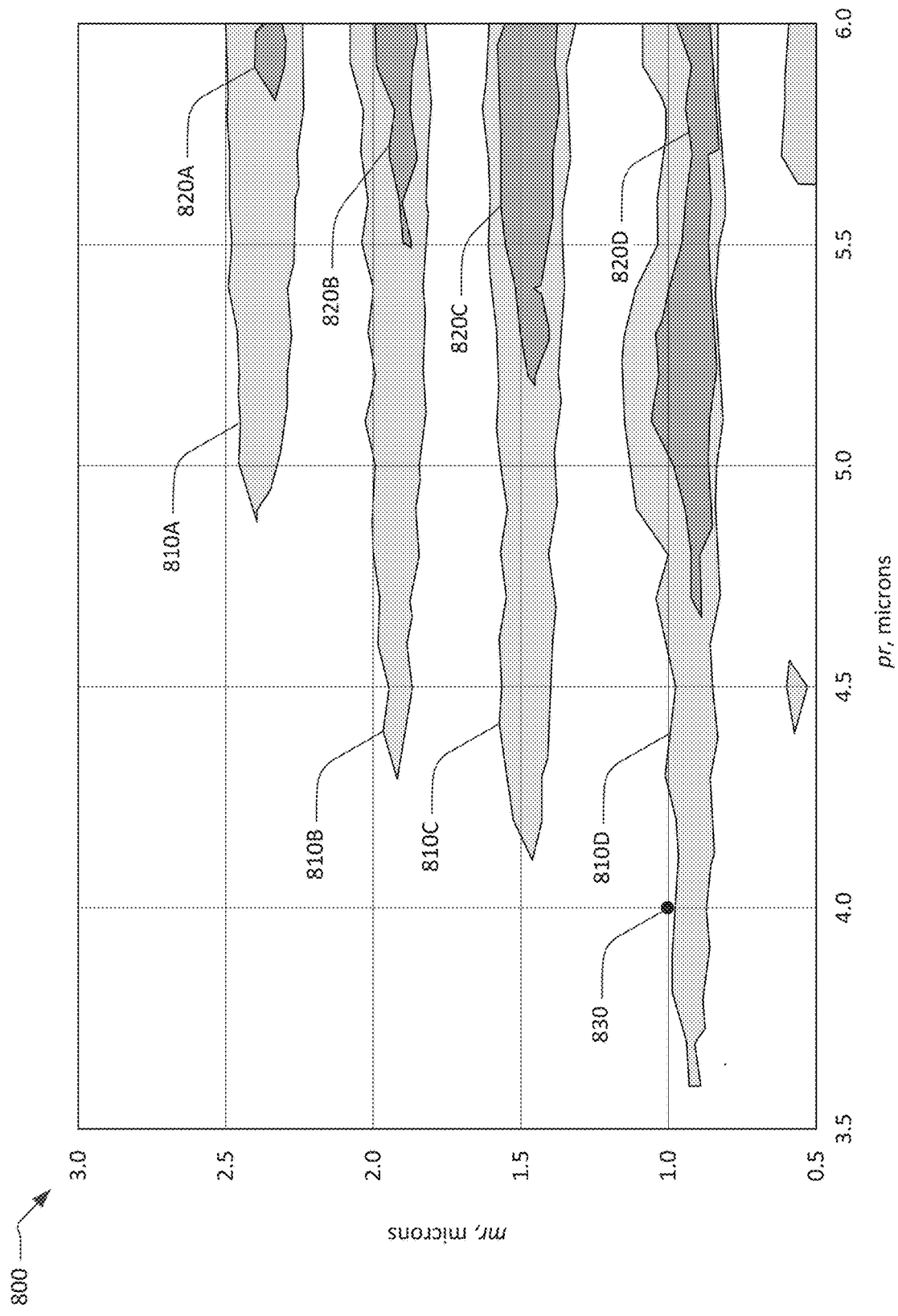
FIG. 8 is a graph showing relative Q-factor as a function of reflector element pitch and mark for a representative XBAR at a frequency of 5150 MHz.

FIG. 8 shows a chart 800 illustrating the relationship between the pitch pr and mark mr of reflector elements of an exemplary XBAR device at a fixed frequency of 5150 MHz. The exemplary XBAR device has a lithium niobate piezoelectric plate with a thickness of 400 nm and aluminum IDT and reflector elements with a thickness of 500 nm. The pitch and mark of the IDT fingers are 4 microns and 1 micron, respectively. There are two reflector elements at each end of the IDT. The lighter shaded area 810A, 810B, 810C, 810D identify combinations of pr and mr where the normalized Q-factor is greater than or equal to 85%. The darker shaded area 820A, 820B, 820C, 820D identify combinations of pr and mr where the normalized Q-factor is greater than or equal to 90%. For comparison, the normalized Q-factor of this XBAR without reflector elements is 74% at 5150 MHz. Although not identified in FIG. 8 there are combinations of pr and mr where the normalized Q-factor is less than 75%, indicating improperly configured reflector elements can degrade XBAR Q-factor.

There are multiple combinations of pr and mr that raise the normalized Q-factor to 85% or 90%. To achieve a normalized Q-factor of greater than or equal to 90%, pr must be greater than or equal to 1.2 times the pitch p of the IDT fingers. For pr=6 microns (1.5p), there are at least four values of mr that raise the normalized Q-factor to more than 90%.

Figure 9:
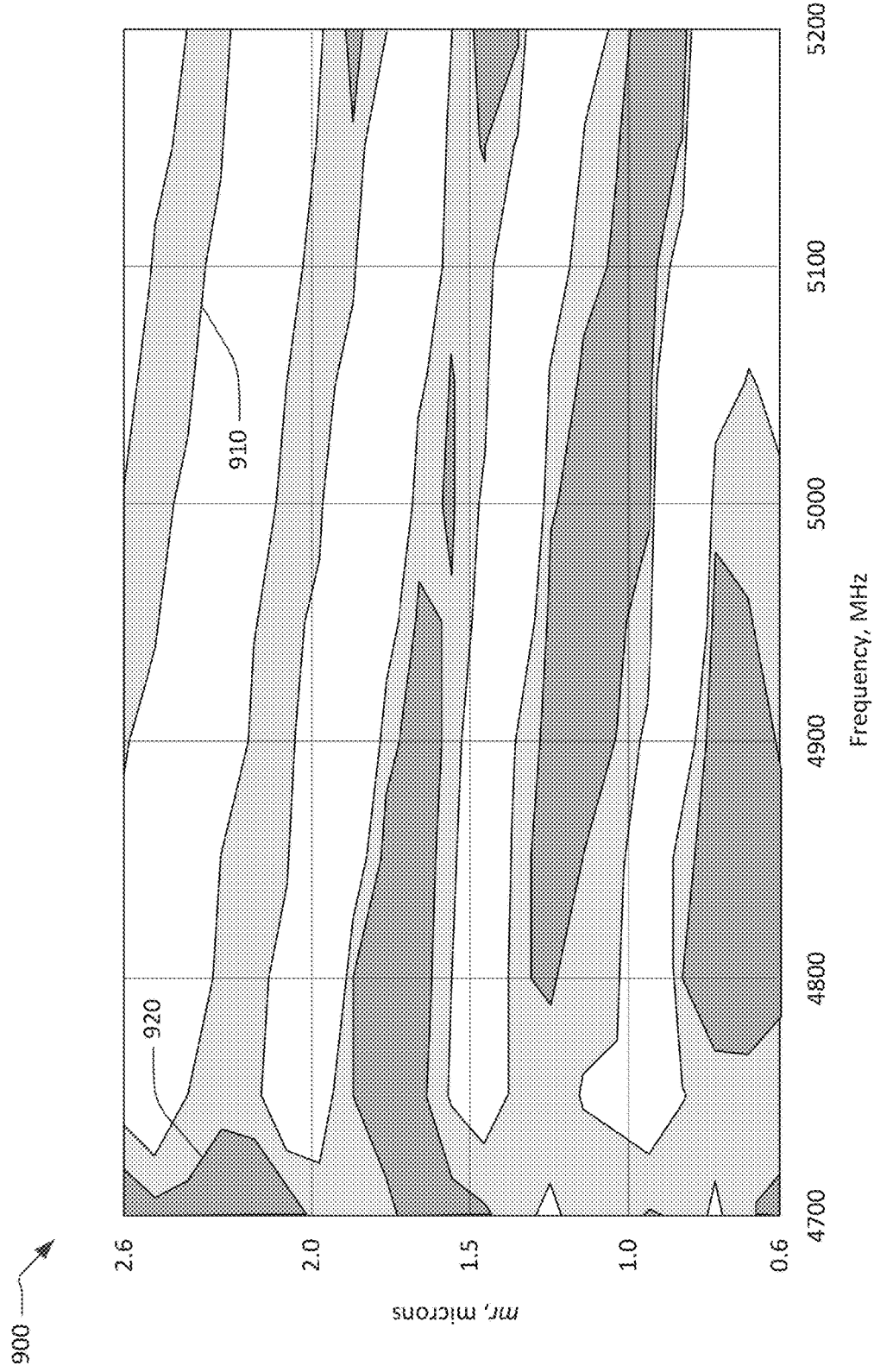
FIG. 9 is a graph showing relative Q-factor as a function of frequency and reflector element mark for an XBAR with two reflector elements at each end.

FIG. 9 shows a chart 900 illustrating the relationship between the mark mr of reflector elements and frequency for an exemplary XBAR device with two reflector elements at each side of an IDT and pr=5.2 microns. As in the previous examples, the exemplary XBAR device has a lithium niobate piezoelectric plate with a thickness of 400 nm and aluminum IDT and reflector elements with a thickness of 500 nm. The pitch and mark of the IDT fingers are 4 microns and 1 micron, respectively. Lighter shaded areas such as area 910 identify combinations of frequency and mr where the normalized Q-factor is greater than or equal to 85%. Darker shaded areas such as area 920 identify combinations of frequency and mr where the normalized Q-factor is greater than or equal to 90%. For comparison, the normalized Q-factor of this XBAR without reflector elements is 74% at 5150 MHz.

The chart 900 illustrates that, for a particular reflector element pitch pr, reflector element mark mr must be selected with consideration of the frequency where the Q-factor of an XBAR needs improvement. For example, selecting mr=0.95 microns provides a normalized Q-factor greater than 90% over a frequency range from about 4980 MHz to greater than 5200 MHz. Selecting mr=1.7 microns provides a normalized Q-factor greater than 90% over a frequency range of less than 4700 MHz to about 4950 MHz. However, selecting mr=1.7 microns may actually lower the Q-factor at 5200 MHz compared to an XBAR with no reflector elements.

Figure 10:
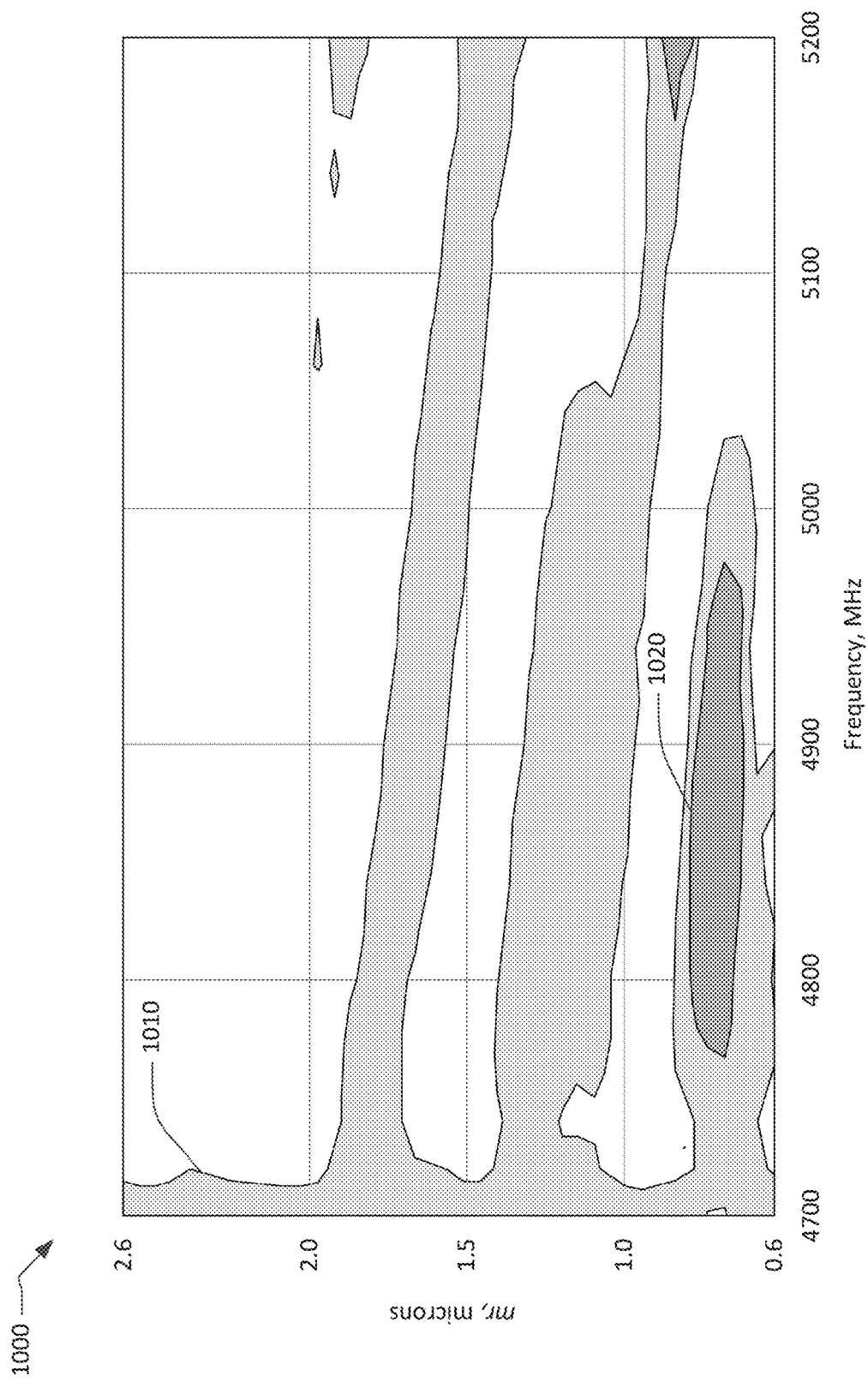
FIG. 10 is a graph showing relative Q-factor as a function of frequency and reflector element mark for an XBAR with one reflector element at each end.

FIG. 10 shows a chart 11000 illustrating the relationship between the mark mr of reflector elements and frequency for an exemplary XBAR device with one reflector element at each side of an IDT and pr=5.2 microns. The exemplary XBAR device is the same as the previous examples. As in FIG. 9, lighter shaded areas such as area 1010 identify combinations of frequency and mr where the normalized Q-factor is greater than or equal to 85%. Darker shaded areas such as area 1020 identify combinations of frequency and mr where the normalized Q-factor is greater than or equal to 90%.

Comparison of FIG. 9 and FIG. 10 shows that a only one reflector element is generally less effective that two reflector elements for at improving normalized Q-factor. However, in some applications one reflector element at each end of an IDT may be sufficient. In this example, one reflector element (at each end of the IDT) with mr=0.75 microns provides a substantial improvement in normalized Q-factor for a frequency range of about 4770 MHz to 4970 MHz.

Figure 11:
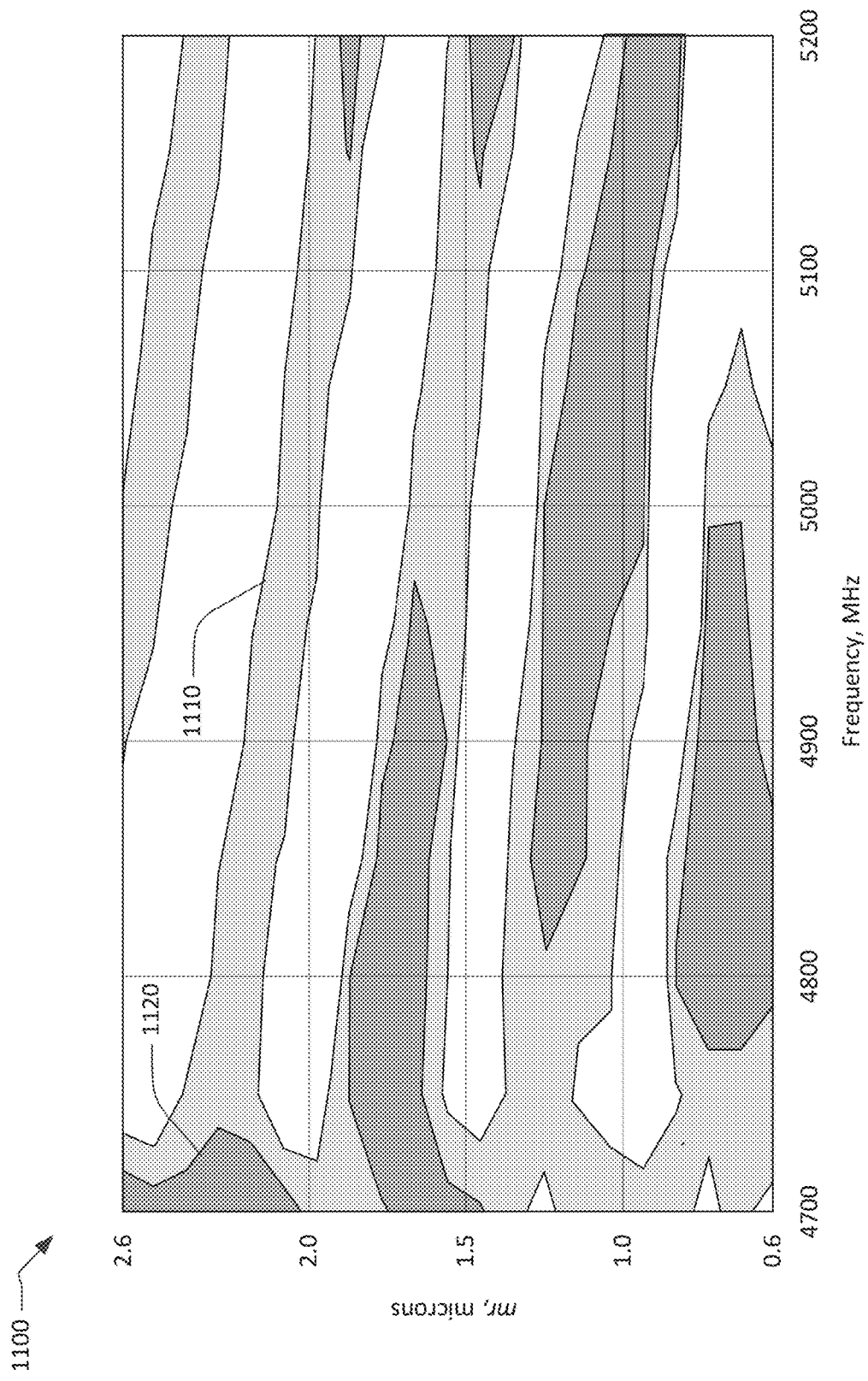
FIG. 11 is a graph showing relative Q-factor as a function of frequency and reflector element mark for an XBAR with five reflector elements at each end.

FIG. 11 shows a chart 1100 illustrating the relationship between the mark mr of reflector elements and frequency for an exemplary XBAR device with five reflector elements at each end of an IDT and pr=5.2 microns. The exemplary XBAR device is the same as the previous examples. As in FIG. 9, lighter shaded areas such as area 1110 identify combinations of frequency and mr where the normalized Q-factor is greater than or equal to 85%. Darker shaded areas such as area 1120 identify combinations of frequency and mr where the normalized Q-factor is greater than or equal to 90%.

Comparison of FIG. 9 and FIG. 11 shows that five reflector elements do not provide any significant improvement over two reflector elements.

Figure 12:
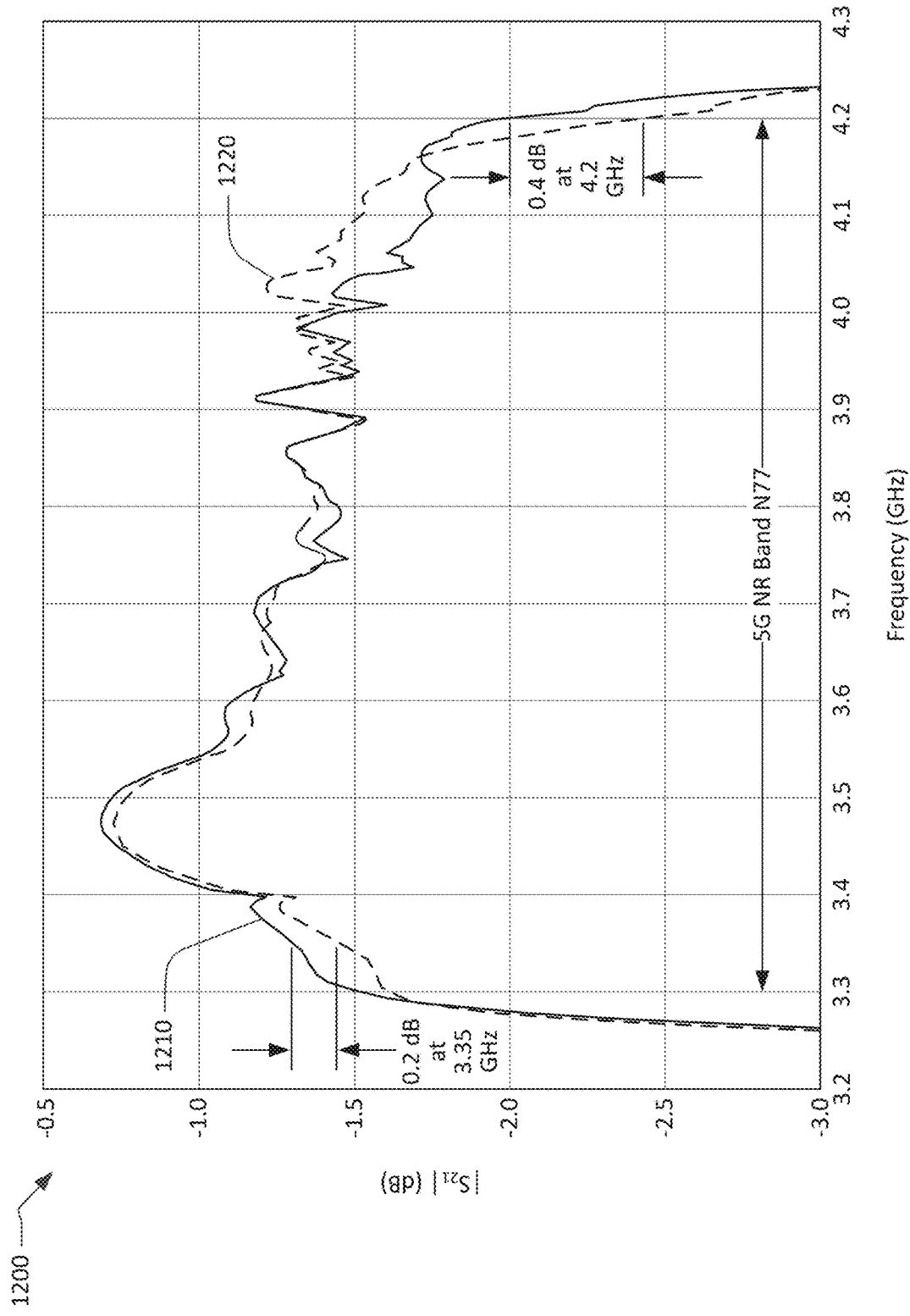
FIG. 12 is a graph comparing the performance of two band-pass filters using XBARs with and without reflector elements.

FIG. 12 is a chart of the performance of an exemplary XBAR bandpass filter with and without reflector elements. Specifically, the solid line 1210 is a plot of the magnitude of $S_{21}$ (the input-output transfer function) of a Band N77 filter with two reflector elements at each end of the XBARs in the filter. The reflector elements of shunt resonators were optimized for a frequency of 3.35 GHz and the reflector elements of series resonators were optimized for a frequency of 4.2 GHz. These frequencies are at or near the edges of the N77 band where it is typically most difficult to achieve requirements on minimum $S_{21}$. The dashed line 1220 is a plot of the magnitude of $S_{21}$ for the same filter without reflector elements on the XBARs. All of the data was developed by simulations of the filters using a finite element method.

The inclusion of reflector elements improves $S_{21}$ by 0.2 db at 3.35 GHz and by 0.4 dB at 4.2 GHz. Note, however, that the inclusion of the reflector elements reduces $S_{21}$ by as much as 0.25 dB at other frequencies, illustrating a tradeoff to be made during the design of an XBAR filter. In the exemplary bandpass filter of FIG. 12, the reflector elements for all of the shunt resonators were selected for maximum Q-factor at the same frequency (3.35 GHz) and the reflector elements for all of the series resonators were selected for maximum Q-factor at the same frequency (4.2 GHz). Further improvements in the filter transfer function are likely if the reflector elements for each resonator are optimized independently.

Description of Methods

Figure 13:
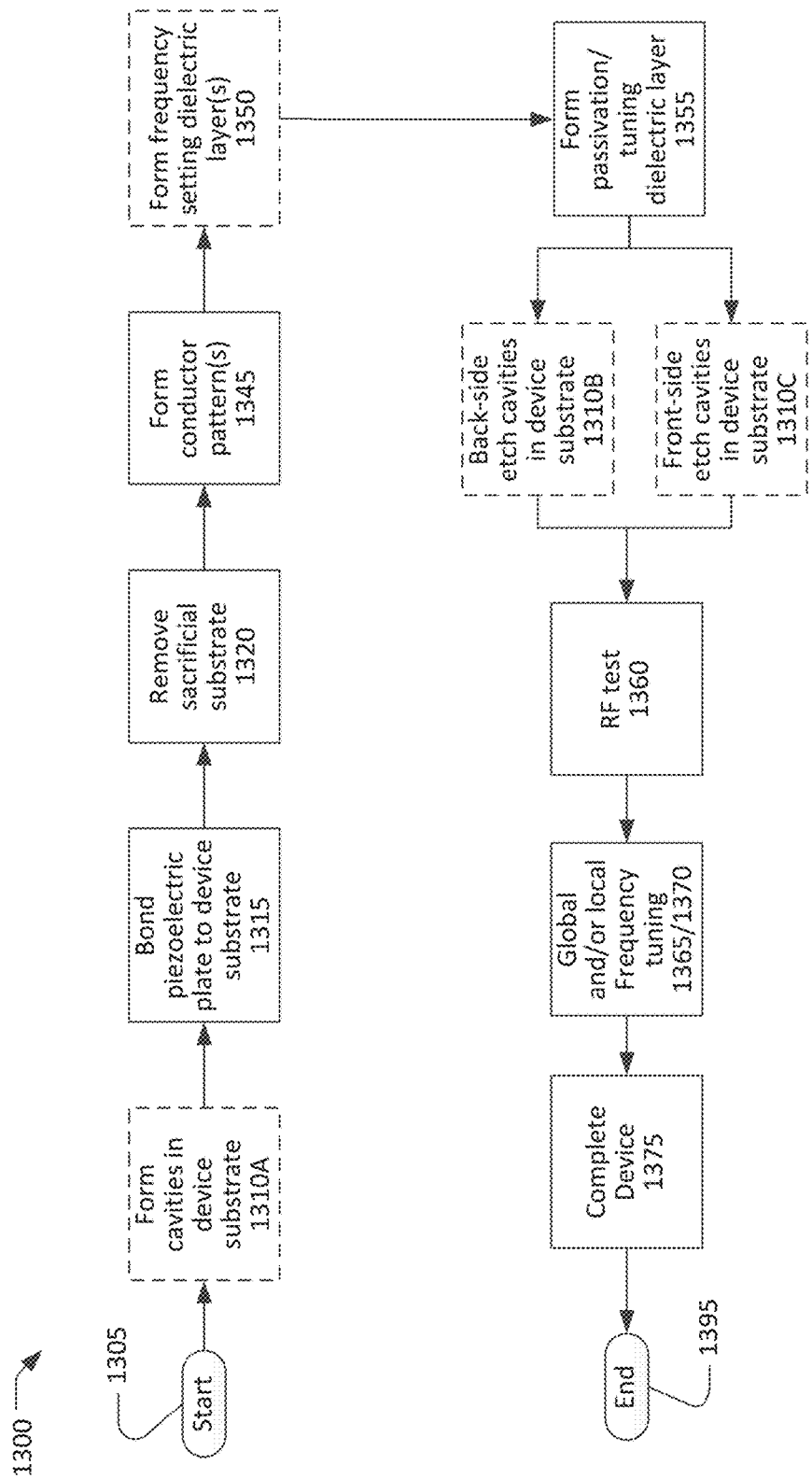
FIG. 13 is a flow chart of a method for fabricating an XBAR or a filter using XBARs.

FIG. 13 is a simplified flow chart summarizing a process 1300 for fabricating a filter device incorporating XBARs. Specifically, the process 1300 is for fabricating a filter device including multiple XBARs, some of which may include a frequency setting dielectric layer. The process 1300 starts at 1305 with a device substrate and a thin plate of piezoelectric material disposed on a sacrificial substrate. The process 1300 ends at 1395 with a completed filter device. The flow chart of FIG. 13 includes only major process steps. Various conventional process steps (e.g. surface preparation, cleaning, inspection, baking, annealing, monitoring, testing, etc.) may be performed before, between, after, and during the steps shown in FIG. 13.

While FIG. 13 generally describes a process for fabricating a single filter device, multiple filter devices may be fabricated simultaneously on a common wafer (consisting of a piezoelectric plate bonded to a substrate). In this case, each step of the process 1300 may be performed concurrently on all of the filter devices on the wafer.

The flow chart of FIG. 13 captures three variations of the process 1300 for making an XBAR which differ in when and how cavities are formed in the device substrate. The cavities may be formed at steps 1310A, 1310B, or 1310C. Only one of these steps is performed in each of the three variations of the process 1300.

The piezoelectric plate may be, for example, lithium niobate or lithium tantalate, either of which may be Z-cut, rotated Z-cut, or rotated YX-cut. The piezoelectric plate may be some other material and/or some other cut. The device substrate may preferably be silicon. The device substrate may be some other material that allows formation of deep cavities by etching or other processing.

In one variation of the process 1300, one or more cavities are formed in the device substrate at 1310A, before the piezoelectric plate is bonded to the substrate at 1315. A separate cavity may be formed for each resonator in a filter device. The one or more cavities may be formed using conventional photolithographic and etching techniques. Typically, the cavities formed at 1310A will not penetrate through the device substrate.

At 1315, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 1320, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 1320, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

Thin plates of single-crystal piezoelectric materials laminated to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of $SiO_2$ may be disposed between the piezoelectric plate and the substrate. When a commercially available piezoelectric plate/device substrate laminate is used, steps 1310A, 1315, and 1320 of the process 1300 are not performed.

A first conductor pattern, including IDTs and reflector elements of each XBAR, is formed at 1345 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 1345 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 1345 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1350, one or more frequency setting dielectric layer(s) may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

At 1355, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 1300, the passivation/tuning dielectric layer may be formed after the cavities in the device substrate are etched at either 1310B or 1310C.

In a second variation of the process 1300, one or more cavities are formed in the back side of the device substrate at 1310B. A separate cavity may be formed for each resonator in a filter device. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 1300, one or more cavities in the form of recesses in the device substrate may be formed at 1310C by etching the substrate using an etchant introduced through openings in the piezoelectric plate. A separate cavity may be formed for each resonator in a filter device. The one or more cavities formed at 1310C will not penetrate through the device substrate.

Ideally, after the cavities are formed at 1310B or 1310C, most or all of the filter devices on a wafer will meet a set of performance requirements. However, normal process tolerances will result in variations in parameters such as the thicknesses of dielectric layer formed at 1350 and 1355, variations in the thickness and line widths of conductors and IDT fingers formed at 1345, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 1355. The frequency of a filter device passband can be lowered by adding material to the passivation/tuning layer, and the frequency of the filter device passband can be increased by removing material to the passivation/tuning layer. Typically, the process 1300 is biased to produce filter devices with passbands that are initially lower than a required frequency range but can be tuned to the desired frequency range by removing material from the surface of the passivation/tuning layer.

At 1360, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 1365, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 1360 may be processed to generate a global contour map indicating the amount of material to be removed as a function of two-dimensional position on the wafer. The material is then removed in accordance with the contour map using the selective material removal tool.

At 1370, local frequency tuning may be performed in addition to, or instead of, the global frequency tuning performed at 1365. "Local" frequency tuning is performed with a spatial resolution smaller than an individual filter device. The test results from 1360 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 1365 and/or 1370, the filter device is completed at 1375. Actions that may occur at 1375 include forming bonding pads or solder bumps or other means for making connection between the device and external circuitry (if such pads were not formed at 1345); excising individual filter devices from a wafer containing multiple filter devices; other packaging steps; and additional testing. After each filter device is completed, the process ends at 1395.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:
1. An acoustic resonator device comprising:
a piezoelectric plate; and
a conductor pattern formed on a surface of the piezoelectric plate, the conductor pattern comprising:

an interdigital transducer (IDT) comprising a first busbar, a second busbar, and n interleaved parallel fingers, where n is a positive integer, wherein the fingers extend alternately from the first and second busbars, and the fingers include a first finger and an n'th finger at opposing ends of the IDT;
a first reflector element proximate and parallel to the first finger; and
a second reflector element proximate and parallel to the n'th finger, wherein
a center-to-center distance pr between the first reflector element and the first finger and between the second reflector element and the n'th finger is greater than or equal to 1.2 times a pitch p of the IDT and less than or equal to 1.5 times the pitch p.

2. The device of claim 1, the conductor pattern further comprising:
a third reflector element proximate and parallel to the first reflector element, wherein the first reflector element is between the third reflector element and the first finger; and
a fourth reflector element proximate and parallel to the second reflector element, wherein the second reflector element is between the fourth reflector element and the n'th finger.

3. The device of claim 2, wherein
a width mr of the first, second, third, and fourth reflector elements is configured to increase a Q-factor of the device at a predetermined frequency.

4. The device of claim 3, wherein
the device is a shunt resonator in a ladder bandpass filter circuit having a passband, and
mr is selected to increase a Q-factor of the device at a lower edge of the passband.

5. The device of claim 3, wherein
the device is a series resonator in a ladder bandpass filter circuit having a passband, and
mr is selected to increase a Q-factor of the device at an upper edge of the passband.

6. The device of claim 2, wherein
the first and third reflector elements and the first finger are connected to a same one of the first and second busbar, and
the second and fourth reflector elements and the n'th finger are connected to a same one of the first and second busbar.

7. The device of claim 2, wherein
the first and third reflector elements are connected to each other and capacitively coupled to the first finger, and
the second and fourth reflector elements are connected to each other and capacitively coupled to the n'th finger.

8. The device of claim 2, wherein
a center-to-center distance between the first and third reflector elements and a center-to-center distance between the second and fourth reflector elements are equal to pr.

9. The device of claim 1, wherein
a width mr of the first and second reflector elements is configured to increase a Q-factor of the device at a predetermined frequency.

10. The device of claim 9, wherein
the device is a shunt resonator in a ladder bandpass filter circuit having a passband, and
mr is selected to increase a Q-factor of the device at a lower edge of the passband.

11. The device of claim 9, wherein
the device is a series resonator in a ladder bandpass filter circuit having a passband, and
mr is selected to increase a Q-factor of the device at an upper edge of the passband.

12. The device of claim 1, wherein
when an RF signal is applied between the first and second busbars, the first reflector element is at substantially the same potential as the first finger and the second reflector element is at substantially the same potential as the n'th finger.

13. The device of claim 12, wherein
the first reflector element and the first finger are connected to a same one of the first and second busbar, and
the second reflector element and the n'th finger are connected to a same one of the first and second busbar.

14. The device of claim 12, wherein
the first reflector element is capacitively coupled to the first finger, and
the second reflector element is capacitively coupled to the n'th finger.

15. An acoustic resonator device comprising:
a substrate;
a piezoelectric plate, a portion of the piezoelectric plate forming a diaphragm spanning a cavity in the substrate; and
a conductor pattern on a surface of the piezoelectric plate, the conductor pattern comprising:
an interdigital transducer (IDT) including a first busbar, a second busbar, and n interleaved parallel fingers, where n is a positive integer, wherein the fingers extend alternately from the first and second busbars, and the fingers include a first finger and an n'th finger at opposing ends of the IDT;
a first reflector element proximate and parallel to the first finger; and
a second reflector element proximate and parallel to the n'th finger, wherein
the n interleaved parallel fingers, the first reflector element, and the second reflector element are on the diaphragm, and
a center-to-center distance pr between the first reflector element and the first finger and between the second reflector element and the n'th finger is greater than or equal to 1.2 times a pitch p of the IDT and less than or equal to 1.5 times the pitch p.

16. The device of claim 15, wherein
a width mr of the first and second reflector elements is configured to increase a Q-factor of the device at a predetermined frequency.

17. The device of claim 15, the conductor pattern further comprising:
a third reflector element proximate and parallel to the first reflector element, wherein the first reflector element is centered between the third reflector element and the first finger; and
a fourth reflector element proximate and parallel to the second reflector element, wherein the second reflector element is centered between the fourth reflector element and the n'th finger, wherein
the third and fourth reflector elements are on the diaphragm.

* * * * *